Jan. 21, 1958 F. T. MULLIKIN 2,820,934

CAPACITOR ASSEMBLY

Filed Aug. 18, 1954

INVENTOR
FORREST T. MULLIKIN

BY

Wayne M. Hart
ATTORNEY

United States Patent Office 2,820,934

Patented Jan. 21, 1958

2,820,934

CAPACITOR ASSEMBLY

Forrest T. Mullikin, Falls Church, Va., assignor to ACF Industries, Incorporated, New York, N. Y., a corporation of New Jersey Application August 18, 1954, Serial No. 450,583

2 Claims. (Cl. 317—260)

This invention relates to improvements in electrical components, and has particular reference to the assembly of a rolled or folded capacitor with an electrically insulating mounting base.

In the manufacture and use of rolled or folded capacitors the problem of attaching terminals to the capacitor electrodes is a serious one. The use of aluminum foil rolled or folded and separated by a flexible, thin dielectric, is not uncommon in modern production techniques. Aluminum foil is reasonably inexpensive and has a number of qualities recommending its use in such capacitors. However, it is difficult to weld or solder to aluminum.

An object of this invention is to provide means for supporting a rolled or folded capacitor and for establishing electrical continuity between external circuitry and the electrodes of the capacitor.

A more specific object of the invention is to provide one or more clamps which are of a material that may easily be soldered to an insulating base and which are bendable so that the capacitor electrodes may be crimped or otherwise held by pressure in the clamp.

A further object of the invention is to enhance the electrical and the mechanical bond between the capacitor electrodes and the clamps by using an adhesive having finely divided conductive particles, such as aluminum, interspersed therein. Such adhesives will serve the further function of sealing atmospheric moisture from the capacitor.

Other objects and features of importance will become apparent in following the description of the illustrated forms of the invention.

Figure 1:
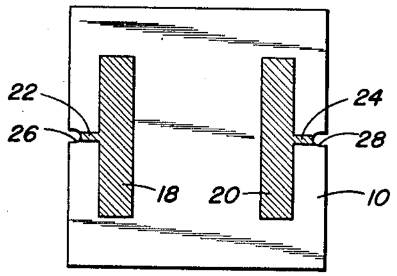
Fig. 1 is a plan view of the insulating base on which the capacitor is mounted, there having been applied to the base coatings of solder.

In Fig. 1 there is shown an electrically insulating panel serving as a base 10 for a rolled and flattened capacitor 12, although this capacitor could well have been illustrated as one of those made by the folding technique. In either case, the capacitor has a number of electrodes 14 extending from one edge thereof and another group of electrodes 16 extending from its opposite edge. If the respective groups 14 and 16 of electrodes are connected together the capacitor becomes non-inductive. The condenser is made in accordance with known practice by placing one upon another, alternate elongated strips of metal and dielectric so arranged that the longitudinal axes of the metal strip do not coincide. When the lamination thus prepared is rolled into a cylinder, the edges of the metal convolutions will extend from the respective ends of the cylinder to form terminals as illustrated by reference character 14 and 16 in Figure 3. Radially applied pressure will contort the cylinder into a flattened configuration.

In electronic equipment, particularly that operating in the radio frequency range or higher, close tolerances for the components are mandatory. When a capacitor is compressed or twisted or bent, its capacitance varies. Accordingly, a rigid base 10 for a rolled or folded capacitor is desirable since it supports and holds the capacitor in a fixed position. If supported along at least two edges, the capacitor has less likelihood of deforming in response to jars, vibrations, and other motions.

The base or wafer designated by reference character 10 is provided with one or more, but preferably two areas of solder 18 and 20 together with circuit connections 22 and 24 which extend therefrom. These circuit connections are adhered to a surface of base 10 in a known way, as spraying metallic paint or screening metallic paint thereon and later dip tinning. Circuit connections 22 and 24 extend from areas 18 and 20 to notches 26 and 28 in base 10, the purpose of the notches being to accommodate conductors or for connection to external circuitry. The solder areas 18 and 20 and circuit connections 22 and 24 may be formed simultaneously by applying paint containing metallic particles on the base 10 and subsequently applying tinning material, as ordinary solder.

Figure 2:
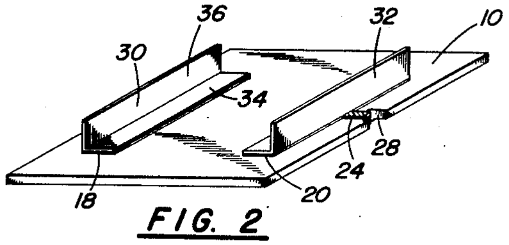
Fig. 2 is a perspective view of the base of Fig. 1 with two clamps secured to the solder.

Thereafter, means for attaching the capacitor 12 to its base 10 are attached to the solder areas 18 and 20. In this regards attention is invited to Fig. 2 where clamps 30 and 32 are shown in place upon the upper surface of base 10. Each clamp is identical in construction and consists of an L shaped angle having sides or legs 34 and 36 connected approximately at right angles to each other. Side 34 is soldered to the solder in area 18 with side 36 standing upward, normal to the upper surface of base 10. Clamp 32 is fastened in the same way at area 16 thereby definining a pocket between upstanding legs, this pocket accommodating capacitor 12.

Figure 3:
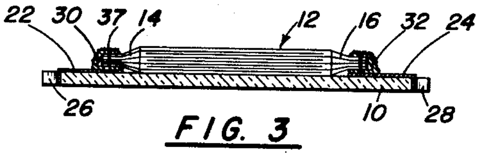
Fig. 3 is an elevation in section showing an embodiment of the invention.

The capacitor is placed between the clamps 30 and 32 and in the pocket defined by them and then, the upstanding sides of the clamps are deformed inwardly, as by bending and/or crimping so that there is a pressure connection between the groups 14 and 16 of electrodes and their respective clamps 30 and 32. The generally transverse depressions 36 (Fig. 5) in clamps 30 and 32 illustrate the principle of crimping or more drastically depressing in localized areas of clamps 30 and 32 in order to insure a firm pressure seal between the clamps and the electrodes. This particular operation is to be done by a machine where large mechanical advantages are available. Very many configurations of heads may be provided in this machine (such as a hydraulic or mechanical press) in order to alter the appearance of the crimps or depression 36 and to alter their relative locations. Accordingly, the specific and actual configuration of depression 36 is open to considerable variation without departing from the broader aspect of pressure sealing the clamps to the electrodes by deforming the clamps. Moreover, the clamps 30 and 32 together with the electrodes therein may be pierced to assist in the clamping operation. After piercing, the clamps may be dip soldered to provide some help in the clamping operation, and to form a moisture and foreign matter shield. As seen in Fig. 3, the solder 37 fills the holes which had been pierced in the clamps and electrodes, and helps to form a firm mechanical connection between the capacitor and the clamps.

Figure 5:
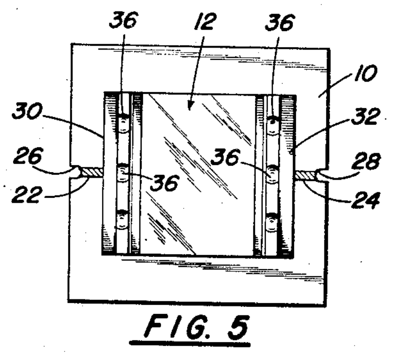
Fig. 5 is a top view of another embodiment of the invention.

Although not essential, it is recommended that the clamps 30 and 32 be made at least as long as the electrodes 14 and 16 so that they are completely covered. Then, the clamps act in the secondary capacity of a moisture barrier. In order to combat further the moisture absorption problem, the entire assembly as shown in Fig. 5 may be dipped or otherwise covered with a protective coating such as one of the more suitable synthetic resinous materials.

Figure 4:
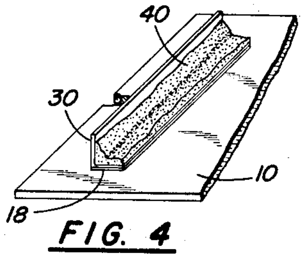
Fig. 4 is a fragmentary perspective view of another embodiment of the invention.

In use of the invention, external circuitry is connected with the circuit connection wiring 22 and 24, solder in areas 18 and 20, the clamps 30 and 32 and finally the capacitor 12 through its electrodes 14 and 16. Accordingly, two conditions must exist for the capacitor to be satisfactorily operative. There must be a firm mechanical connection between clamps 30 and 32 and the capacitor electrodes 14 and 16. The reason for this is that there should be no motion of the capacitor 12 with respect to its supporting base 10. To aid in this regard, a quantity of cement may be applied to the capacitor 12 or to the base 10 so that when the capacitor 12 is seated on base 10 between the clamps 30 and 32, the cement holds it, coacting with clamps 30 and 32 for final, secure attachment. The second important reason why there must be firm connection between the capacitor electrodes and clamps is one of electrical continuity. Inspection of Fig. 3 shows clearly that the clamps 30 and 32 are an intermediate part in the circuit. As an aid in both mechanical connection and electrical continuity various expedients may be resorted to. One is illustrated in Fig. 4, where a quantity of cement 40 is shown to be present in the clamp 30. This cement contains conductive metal particles, as aluminum, and the cement aids in holding the capacitor 12 firmly in place.

Many modifications may be made without departing from the inventive concept. The invention is not to be deemed as limited except within the scope of the appended claims.

What is claimed is:

1. In a capacitor assembly, a base of flat rigid insulating material having notches in the edges thereof, spaced parallel elongated solder areas on said base, metallic conductors on said base leading between their respective solder areas and notches, a wound capacitor having aluminum foil electrodes projecting from opposite ends thereof, and elongated metallic clamps of channel section in soldered engagement with their respective solder areas, each clamp having parallel opposed leg portions in clamping engagement with its respective electrode, said leg portions each having a length substantially corresponding to the width of said electrodes.

2. In a capacitor assembly, a base of flat rigid insulating material having notches in the edges thereof, spaced parallel elongated solder areas on said base, metallic conductors on said base leading between their respective solder areas and notches, a wound capacitor having foil electrodes projecting from opposite ends thereof, and elongated metallic clamps of channel section in soldered engagement with their respective solder areas, each clamp having parallel opposed leg portions in clamping engagement with its respective electrode, said leg portions each having a length substantially corresponding to the width of said electrodes, said capacitor being of greater width than thickness and having flat surfaces on opposite sides thereof, with one of said surfaces in flush engagement with said base.

References Cited in the file of this patent

UNITED STATES PATENTS

| | | |
|---|---|---|
| 774,115 | Splitdorf | Nov. 1, 1904 |
| 1,710,412 | Dubilier | Apr. 23, 1929 |
| 2,075,891 | Dubilier | Apr. 6, 1937 |
| 2,224,288 | Chapman | Dec. 10, 1940 |

FOREIGN PATENTS

| | | |
|---|---|---|
| 524,657 | Great Britain | Aug. 12, 1940 |
| 587,778 | Great Britain | May 6, 1947 |